(12) United States Patent
Yen et al.

(10) Patent No.: US 10,686,030 B2
(45) Date of Patent: Jun. 16, 2020

(54) RESISTOR STRUCTURE

(71) Applicant: Taiwan Semiconductor Manufacturing Company, Ltd., Hsinchu (TW)

(72) Inventors: Hsiu-Jung Yen, Shuishang Township (TW); Jen-Pan Wang, Tainan (TW); Yu-Hong Pan, Tainan (TW); Chih-Fu Chang, Neipu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 191 days.

(21) Appl. No.: 15/707,271

(22) Filed: Sep. 18, 2017

(65) Prior Publication Data

US 2018/0026091 A1  Jan. 25, 2018

Related U.S. Application Data

(62) Division of application No. 13/935,846, filed on Jul. 5, 2013, now Pat. No. 9,768,243.

(60) Provisional application No. 61/778,322, filed on Mar. 12, 2013.

(51) Int. Cl.
*H01L 27/08* (2006.01)
*H01L 49/02* (2006.01)
*H01L 27/06* (2006.01)

(52) U.S. Cl.
CPC .......... *H01L 28/20* (2013.01); *H01L 27/0629* (2013.01); *H01L 27/0802* (2013.01)

(58) Field of Classification Search
CPC .. H01L 27/0629; H01L 27/0802; H01L 28/20
USPC ........................................ 438/332
See application file for complete search history.

(56) References Cited

U.S. PATENT DOCUMENTS

| | | | |
|---|---|---|---|
| 6,476,483 B1 | 11/2002 | Adler et al. | |
| 2004/0026762 A1 | 2/2004 | Hirano | |
| 2005/0212082 A1 | 9/2005 | Takeda et al. | |
| 2010/0320544 A1 | 12/2010 | Tseng et al. | |
| 2013/0029449 A1* | 1/2013 | Cheng ............... | H01L 21/02532 438/59 |
| 2013/0168816 A1 | 7/2013 | Kang et al. | |

* cited by examiner

*Primary Examiner* — Long K Tran
(74) *Attorney, Agent, or Firm* — Slater Matsil, LLP

(57) ABSTRACT

A plurality of openings is formed in a dielectric layer formed on a semiconductor substrate. The plurality of openings comprises a first opening extending to the semiconductor substrate, a second opening extending to a first depth that is substantially less than a thickness of the dielectric layer, and a third opening extending to a second depth that is substantially greater than the first depth. A multi-layer gate electrode is formed in the first opening. A thin resistor structure is formed in the second opening, and a connection structure is formed in the third opening, by filling the second and third openings substantially simultaneously with a resistor metal.

20 Claims, 5 Drawing Sheets

RESISTOR STRUCTURE

PRIORITY CLAIM AND CROSS-REFERENCE

This is a divisional of U.S. patent application Ser. No. 13/935,846, filed on Jul. 5, 2013, and entitled "Novel Structure of Resistor," which claims priority to U.S. Provisional Application Ser. No. 61/778,322, filed on Mar. 12, 2013, entitled "Novel Structure of W-Resistor," which applications are hereby incorporated herein by reference.

BACKGROUND

In the manufacture of integrated circuits, resistors are often constructed using doped poly-silicon, and connections between components of the integrated circuit are often constructed using a different material. Thus, fabricating the resistor and the connections includes depositing two different materials, each perhaps having its own mask, planarization, etc., thereby increasing the processing steps, complexity, and cost.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
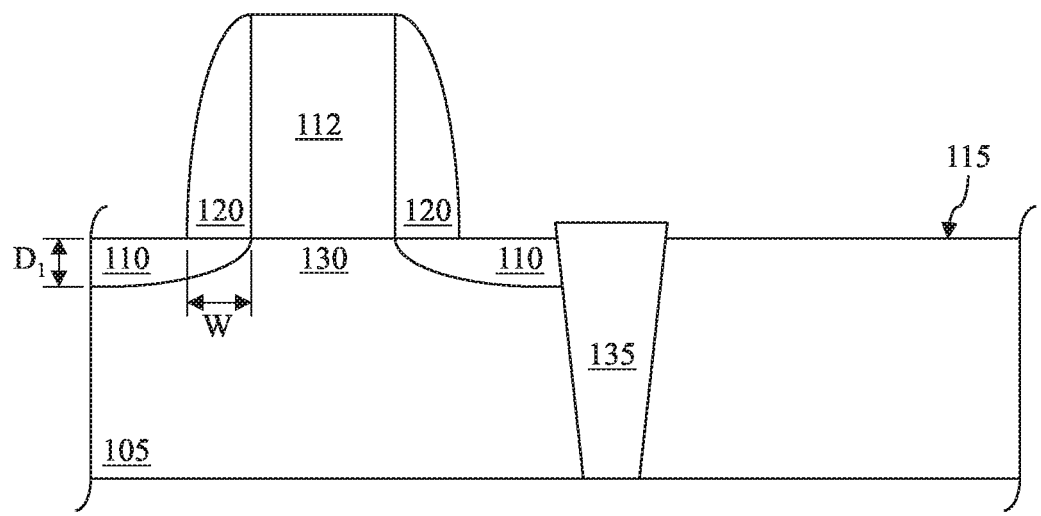
FIG. 1 is a schematic view of at least a portion of apparatus in an intermediate stage of manufacture according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed except where specifically noted as indicating a relationship. Moreover, the formation of a first feature over or on a second feature in the description that follows may include embodiments in which the first and second features may be formed in direct contact, and may also include embodiments in which additional features may be formed interposing the first and second features, such that the first and second features may not be in direct contact.

One or more aspects of the present disclosure are presented in the context of manufacturing microelectronic devices comprising one or more transistors, resistors, and/or other components forming one or more integrated circuits. However, one or more aspects of the present disclosure may also be applicable or readily adaptable to other microelectronic devices of like construction, such as logic gates, inverters, P-type metal oxide semiconductor (PMOS) devices (e.g., for pull-up transistors), and N-type metal oxide semiconductors (NMOS) devices (e.g., for pull-down transistors), among others.

FIG. 1 is a schematic view of at least a portion of an apparatus 100 in an intermediate stage of manufacture according to one or more aspects of the present disclosure. The apparatus 100 is fabricated from/on a substrate 105, which may comprise bulk silicon, strained silicon, silicon germanium, and/or other materials. The substrate 105 may also be or comprise a silicon-on-insulator (SOI) substrate, such as a silicon-on-sapphire substrate, a silicon germanium-on-insulator substrate, and/or another substrate comprising an epitaxial semiconductor layer on an insulator layer. However, the substrate 105 may comprise additional or alternative materials within the scope of the present disclosure. The substrate 105 may have a <100>, <110>, or other surface orientation. The substrate 105 may also comprise one or more isolation structures 135, such as shallow trench isolation (STI) features and/or local oxidation of silicon (LOCOS) features, among others. The isolation structures 135 may be flush with an upper surface 115 of the substrate 105, or may protrude slightly above the substrate surface 115, as shown in FIG. 1.

The substrate 105 also comprises source/drain regions 110 and one or more spacers 120. The source/drain regions 110 are formed in and/or near the upper surface 115 of the substrate 105. For example, the source/drain regions 110 may be formed by ion implantation, perhaps utilizing a dummy gate electrode 112 as a mask, and thereby defining a channel region 130 in the semiconductor substrate 105 between the source/drain regions 110. The source/drain regions 110 may comprise p-type and/or n-type impurities, such as phosphorus, arsenic, boron, and/or other materials. Subsequent diffusion, annealing, and/or electrical activation processes may also be employed after implantation. Fabrication of the source/drain regions 110 may utilize an energy level ranging between about five keV and about 40 keV, and a dose ranging between about $1 \times 10^{13}$ cm$^{-2}$ and about $5 \times 10^{15}$ cm$^{-2}$, although other energy levels and/or doses are also within the scope of the present disclosure. A subsequent rapid thermal anneal process, perhaps in excess of 1000 degrees Centigrade, may additionally be performed. Although not shown, the source/drain regions 110 may also comprise silicide regions formed by depositing a metal layer that is then annealed and/or otherwise caused to react with silicon of the substrate 105. The maximum depth $D_1$ of the source/drain regions 110 may be about 200 angstroms, although other depths are also within the scope of the present disclosure.

The spacers 120 may comprise one or more spacers substantially extending around the perimeter of the dummy gate electrode 112. In this context, reference hereafter to multiple spacers 120 includes embodiments in which one or more such wrap-around spacers may be employed. The spacers 120 may comprise one or more layers of silicon nitride, silicon oxide, silicon oxynitride, a combination thereof, and/or other materials. Forming the spacers 120 around the dummy gate electrode 112 may comprise low pressure chemical vapor deposition, rapid thermal chemical vapor deposition, atomic layer chemical vapor deposition, and/or plasma enhanced chemical vapor deposition (hereafter collectively referred to as CVD), perhaps utilizing tetraethyl orthosilicate and oxygen as a precursor. The spacers 120 may also be formed by an oxidation process, such as wet or dry thermal oxidation in an ambient environment comprising an oxide, water, nitric oxide, or a combination thereof, and/or other processes. Fabrication of the spacers 120 may also comprise chemical-mechanical polishing or planarizing (hereafter collectively referred to as CMP), isotropic etching, and/or anisotropic etching. The width W of the spacers 120 may range between about 50 angstroms and about 400 angstroms, although other widths are also within the scope of the present disclosure.

Figure 2:
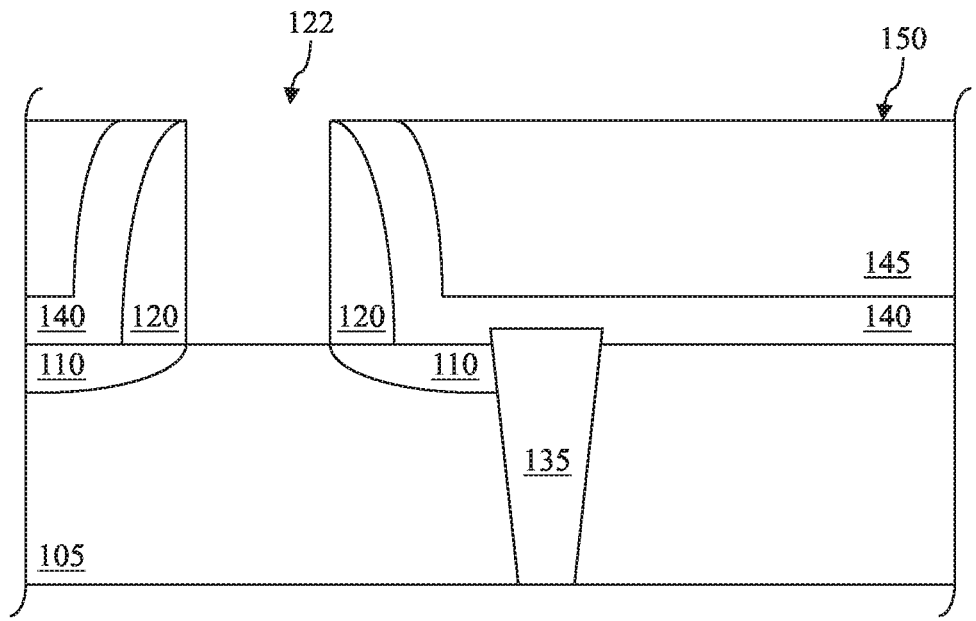
FIG. 2 is a schematic view of the apparatus shown in FIG. 1 in a subsequent stage of manufacture according to one or more aspects of the present disclosure.

FIG. 2 is a schematic view of the apparatus 100 shown in FIG. 1 in a subsequent stage of manufacture according to one or more aspects of the present disclosure. The apparatus 100 also comprises a contact etching stop layer 140. The contact etching stop layer 140, which may be embodied in a high stress film, may be utilized to create a tensile stress along the <100> and/or another direction. The contact etching stop layer 140 may comprise silicon nitride and/or other tensile stress material, and may be formed by CVD and/or other processes. The contact etching stop layer 140 may be formed over the spacers 120, the dummy gate electrode 112, and at least a portion of the substrate 105, such as over the source/drain regions 110 and/or one or more of the isolation structures 135. Subsequent CMP processing may expose the dummy gate electrode 112, such that one or more etching and/or other processes may remove the dummy gate electrode 112 to form an opening 122. The contact etching stop layer 140 may exert a tensile stress in the range of about 50 megapascals to about 2.0 gigapascals along the source-to-drain direction. The thickness of the contact etching stop layer 140 may range between about 300 angstroms and about 1000 angstroms, although other thicknesses are also within the scope of the present disclosure.

The apparatus 100 also comprises one or more interlayer dielectric layers 145 overlying at least portions of the contact etching stop layer 140. The one or more interlayer dielectric layers 140 may comprise silicon oxide, BLACK DIAMOND (a product of Applied Materials of Santa Clara, Calif.), and/or other materials, and may be formed by CVD, sputtering, spin-on coating, and/or other processes. The one or more interlayer dielectric layers 145 may be deposited on the contact etching stop layer 140 prior to the above-described CMP process, such that the portion of the one or more interlayer dielectric layers 145 proximate the spacers 120 may be flush with the upper extent of the spacers 120 and the portions of the contact etching stop layer 140 that interpose the spacers 120 and the one or more interlayer dielectric layers 145. Accordingly, a substantially planar upper surface 150 may comprise portions of the one or more interlayer dielectric layers 145, the contact etching stop layer 140, and the spacers 120. The thickness of the one or more interlayer dielectric layers 145 over the laterally extending portions of the contact etching stop layer 140 may range between about 1500 angstroms and about 8000 angstroms, although other thicknesses are also within the scope of the present disclosure.

Figure 3:
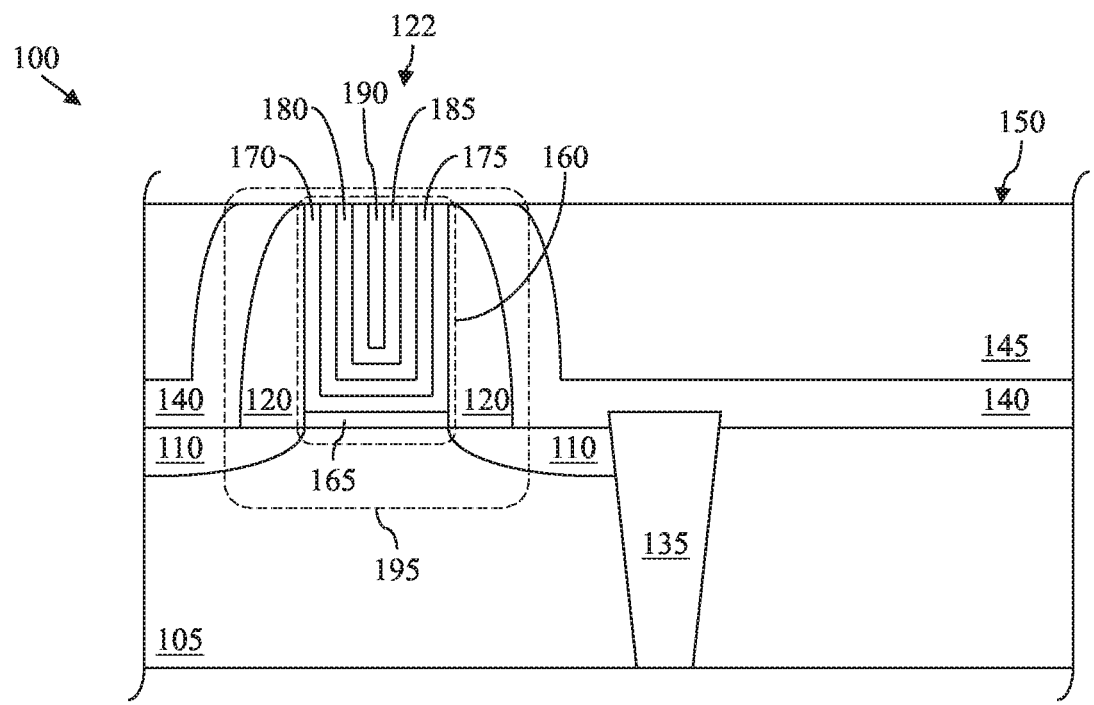
FIG. 3 is a schematic view of the apparatus shown in FIG. 2 in a subsequent stage of manufacture according to one or more aspects of the present disclosure.

FIG. 3 is a schematic view of the apparatus 100 shown in FIG. 2 in a subsequent stage of manufacture according to one or more aspects of the present disclosure. The apparatus 100 also comprises a multi-layer gate electrode 160 formed in the opening 122. The multi-layer gate electrode 160 may comprise or be formed over a dielectric film 165 at the bottom of the opening 122. The dielectric film 165 may have a relative permittivity value greater than about four, and may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. The dielectric film 165 may be formed by epitaxial growth, deposition, and/or other processes. For example, the dielectric film 165 may be formed by an oxidation process such as wet or dry thermal oxidation in an ambient environment with an oxide, water, nitric oxide, or a combination thereof, or by chemical vapor deposition techniques utilizing tetraethyl orthosilicate and oxygen as a precursor. The thickness of the dielectric film 165 may range between about eight angstroms and about 200 angstroms, although other thicknesses are also within the scope of the present disclosure.

The multi-layer gate electrode 160 comprises a first structural layer 170 lining the internal surfaces of the opening 122, including along the interior walls of the spacers 120 and on the dielectric film 165. The first structural layer 170 may comprise one or more of titanium nitride, tantalum nitride, titanium, titanium aluminum, hafnium oxide, lanthanum oxide, silicon oxide, silicon nitride, and silicon oxynitride, although other materials are also within the scope of the present disclosure. The first structural layer 170 may be formed by CVD and/or other processes, and may have a thickness ranging between about ten angstroms and about 200 angstroms, although other thicknesses are also within the scope of the present disclosure.

The multi-layer gate electrode 160 also comprises a second structural layer 175 formed over the first structural layer 170, lining the internal surfaces of the opening 122 defined by the first structural layer 170. The second structural layer 175 may comprise one or more of titanium nitride, tantalum nitride, titanium, titanium aluminum, hafnium oxide, lanthanum oxide, silicon oxide, silicon nitride, and silicon oxynitride, among other materials within the scope of the present disclosure, but may have a composition that substantially differs from that of the first structural layer 175. The second structural layer 175 may be formed by CVD and/or other processes, and may have a thickness ranging between about ten angstroms and about 200 angstroms, although other thicknesses are also within the scope of the present disclosure.

The multi-layer gate electrode 160 also comprises a third structural layer 180 formed over the second structural layer 175, lining the internal surfaces of the opening 122 defined by the second structural layer 175. The third structural layer 175 may comprise one or more of titanium nitride, tantalum nitride, titanium, titanium aluminum, hafnium oxide, lanthanum oxide, silicon oxide, silicon nitride, and silicon oxynitride, among other materials within the scope of the present disclosure, but may have a composition that substantially differs from that of the second structural layer 175. The third structural layer 180 may be formed by CVD and/or other processes, and may have a thickness ranging between about ten angstroms and about 200 angstroms, although other thicknesses are also within the scope of the present disclosure.

The multi-layer gate electrode 160 also comprises a fourth structural layer 185 formed over the third structural layer 180, lining the internal surfaces of the opening 122 defined by the third structural layer 180. The fourth structural layer 185 may comprise one or more of titanium nitride, tantalum nitride, titanium, titanium aluminum, hafnium oxide, lanthanum oxide, silicon oxide, silicon nitride, and silicon oxynitride, among other materials within the scope of the present disclosure, but may have a composition that substantially differs from that of the third structural layer 180. The fourth structural layer 185 may be formed by CVD and/or other processes, and may have a thickness ranging between about ten angstroms and about 200 angstroms, although other thicknesses are also within the scope of the present disclosure.

The composition and order of the structural layers 170, 175, 180, and 185 may vary within the scope of the present disclosure. For example, one or more of the structural layers 170, 175, 180, and 185 may be utilized as a barrier layer preventing diffusion between adjacent ones of the structural layers 170, 175, 180, and 185. Such barrier layers may comprise tantalum nitride and/or titanium nitride, although other materials are also possible. One or more of the structural layers 170, 175, 180, and 185 may also or alternatively be utilized as an adhesion layer preventing delamination of adjacent ones of the structural layers 170, 175, 180, and 185. Such adhesion layers may comprise tantalum nitride and/or titanium nitride, although other materials are also possible. One or more of the structural layers 170, 175, 180, and 185 may also or alternatively be utilized as a high-k dielectric layer providing electrical isolation between adjacent ones of the structural layers 170, 175, 180, and 185. Such high-k dielectric layers may comprise hafnium oxide and/or lanthanum oxide, although other materials are also possible. One or more of the structural layers 170, 175, 180, and 185 may also or alternatively be employed for its selective etching relative to others of the structural layers 170, 175, 180, and 185. For example, silicon nitride and silicon oxide may be utilized for two (or more) of the structural layers 170, 175, 180, and 185 to take advantage of the different etching selectivity of these two materials.

The multi-layer gate electrode 160 also comprises a conductive material 190 formed over the fourth structural layer 185, filling the volume remaining in the opening 122 defined by the fourth structural layer 185. The conductive material 190 may comprise one or more of aluminum, cobalt, copper, and tungsten, among other materials within the scope of the present disclosure, and may be formed by CVD, sputtering, and/or other processes.

In forming the multi-layer gate electrode 160, one or more CMP and/or other processes may be utilized to remove portions of the structural layers 170, 175, 180, and 185 and the conductive material 190 to approximately the level of the upper surface 150 of the interlayer dielectric layer 145. Consequently, the multi-layer gate electrode 160 may be all that remains in the opening 122. Thus, the multi-layer gate electrode 160 may comprise a central gate electrode formed from the conductive material 190, and a plurality of gate electrode layers (170, 175, 180, 185) collectively interposing the central gate electrode and the spacers 120. The gate electrode 160 may complete a field effect transistor (FET) 195, in conjunction with the source/drain regions 110, the channel region 130 in the substrate 105, and the dielectric film 165 operating as a gate dielectric layer.

Figure 4:
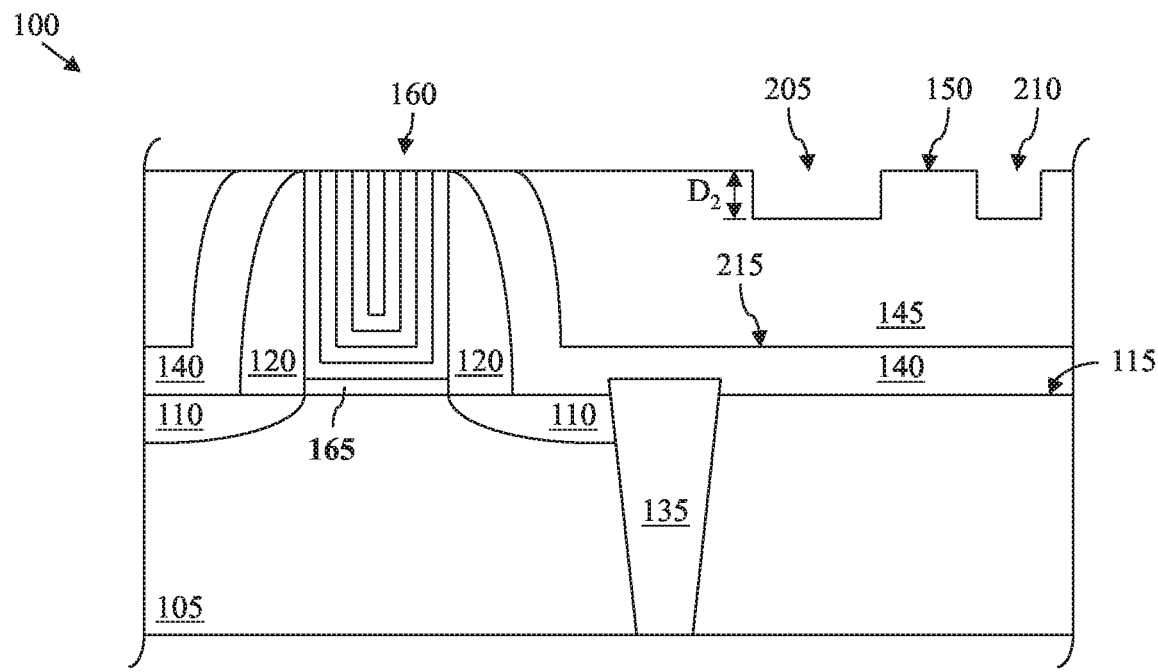
FIG. 4 is a schematic view of the apparatus shown in FIG. 3 in a subsequent stage of manufacture according to one or more aspects of the present disclosure.

FIG. 4 is a schematic view of the apparatus 100 shown in FIG. 3 in a subsequent stage of manufacture according to one or more aspects of the present disclosure. The apparatus 100 also comprises openings 205 and 210 formed in the upper surface 150, such as by chemical etching, plasma etching, focused ion beam (FIB) processing, and/or other processes. Such processing may be employed to remove material from the one or more interlayer dielectric layers 145 to a depth extending only partially into the one or more interlayer dielectric layers 145, and thus not extending to the surface 215 of the contact etching stop layer 140. For example, the depth $D_2$ of the openings 205 and 210 may range between about 250 angstroms and about 1500 angstroms, although other depths are also within the scope of the present disclosure, including embodiments in which the opening 210 extends through the one or more interlayer dielectric layers 145 to the contact etching stop layer 140, or even to the surface 115 of the substrate 105. The openings 205 and 210 may be formed substantially simultaneously with one or more of the processing steps described above. For example, the etching and/or other processing utilized to remove the dummy gate electrode 112 and thus form the opening 122 between the spacers 120 may also be utilized to form the openings 205 and 210. However, the openings 205 and 210 may also be formed together by their own dedicated processing, which may comprise fabrication of a mask on the surface 155 of the one or more interlayer dielectric layers 145 and subsequent etching utilizing such mask. The openings 205 and 210 may also be formed by separate processes each dedicated to forming only one but not both of the openings.

Figure 5:
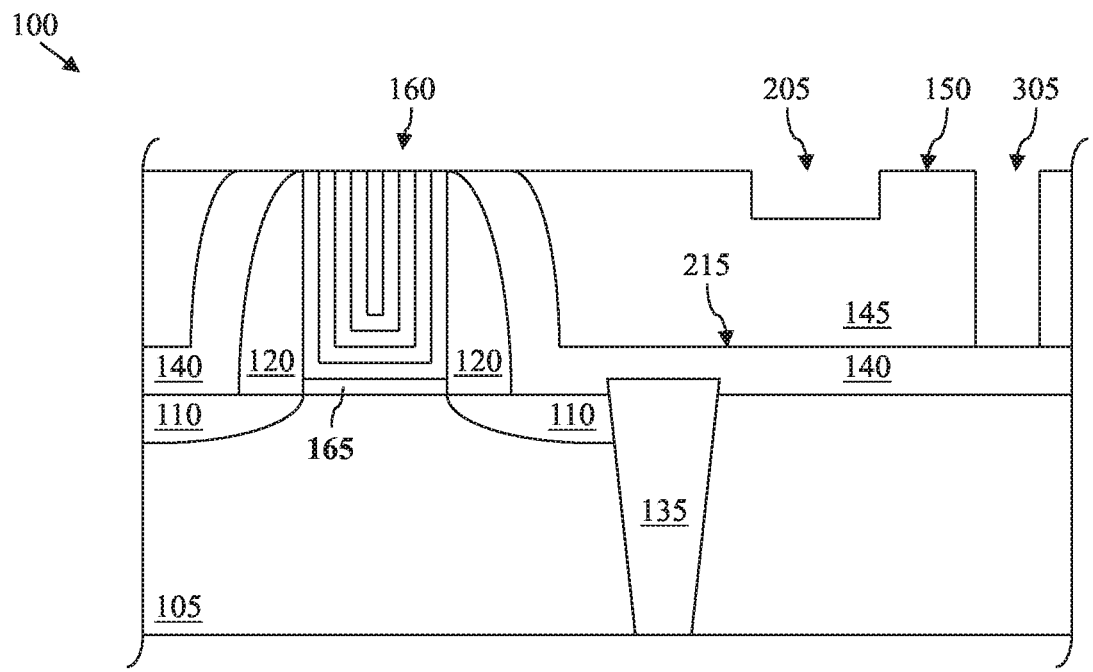
FIG. 5 is a schematic view of the apparatus shown in FIG. 4 in a subsequent stage of manufacture according to one or more aspects of the present disclosure.

FIG. 5 is a schematic view of the apparatus 100 shown in FIG. 4 in a subsequent stage of manufacture according to one or more aspects of the present disclosure, in which an opening 305 has been formed by deepening the opening 210, such as by chemical etching, plasma etching, FIB processing, and/or other processes. Such processing may be employed to remove material from the one or more dielectric layers 145 such that the opening 305 may have a depth extending possibly to the surface 215 of the contact etching stop layer 140. The opening 305 may be formed substantially simultaneously with one or more of the processing steps described above. For example, the etching and/or other processing utilized to form openings 122, 205, and/or 210 may also be utilized to form the opening 305. However, the opening 305 may also be formed by its own dedicated processing, which may comprise fabrication of a mask on the surface 150 of the one or more interlayer dielectric layers 145 and subsequent etching utilizing such mask. The opening 305 may also be formed by one or more processes in lieu of forming the opening 210, such that the opening 210 shown in FIG. 4 may be omitted.

Figure 6:
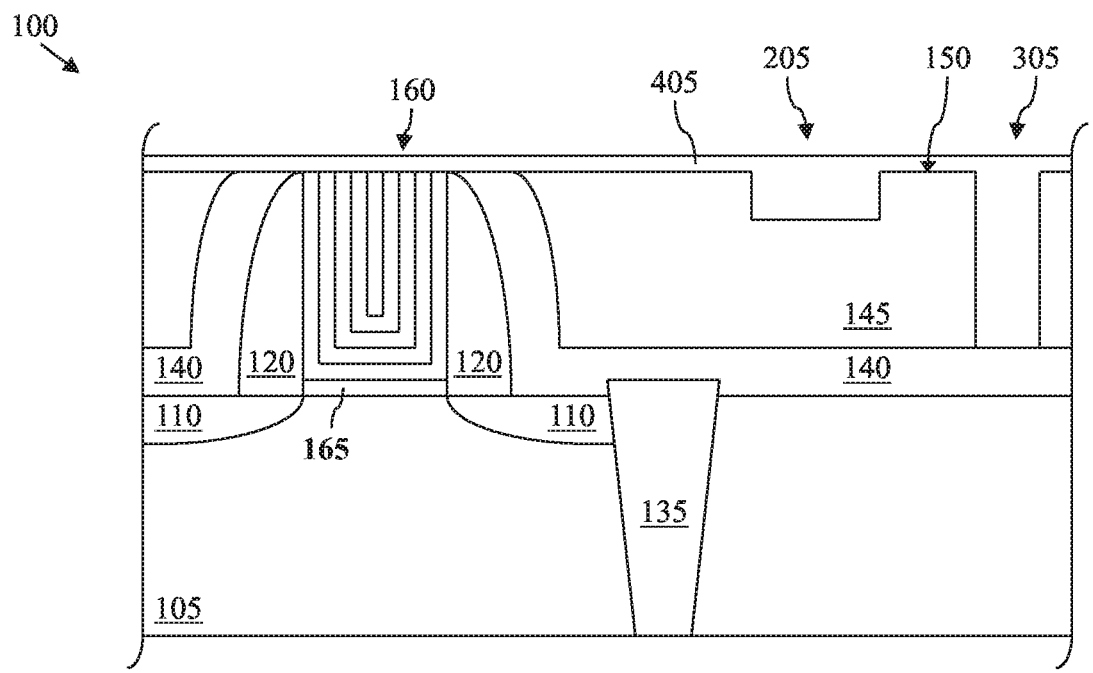
FIG. 6 is a schematic view of the apparatus shown in FIG. 5 in a subsequent stage of manufacture according to one or more aspects of the present disclosure.

FIG. 6 is a schematic view of the apparatus 100 shown in FIG. 5 in a subsequent stage of manufacture according to one or more aspects of the present disclosure. The apparatus 100 also comprises a resistor metal layer 405 formed over the multi-layer gate electrode 160, the openings 205 and 305, and the upper surface 150 of the one or more interlayer dielectric layers 145. The resistor metal layer 405 may substantially comprise tungsten, although additional and/or alternative materials are also within the scope of the present disclosure. The resistor metal layer 405 may be formed by CVD and/or other processes, and may have a thickness (e.g., not within the openings 205 and/or 305) ranging between about ten angstroms and about 500 angstroms, although other thicknesses are also within the scope of the present disclosure.

Figure 7:
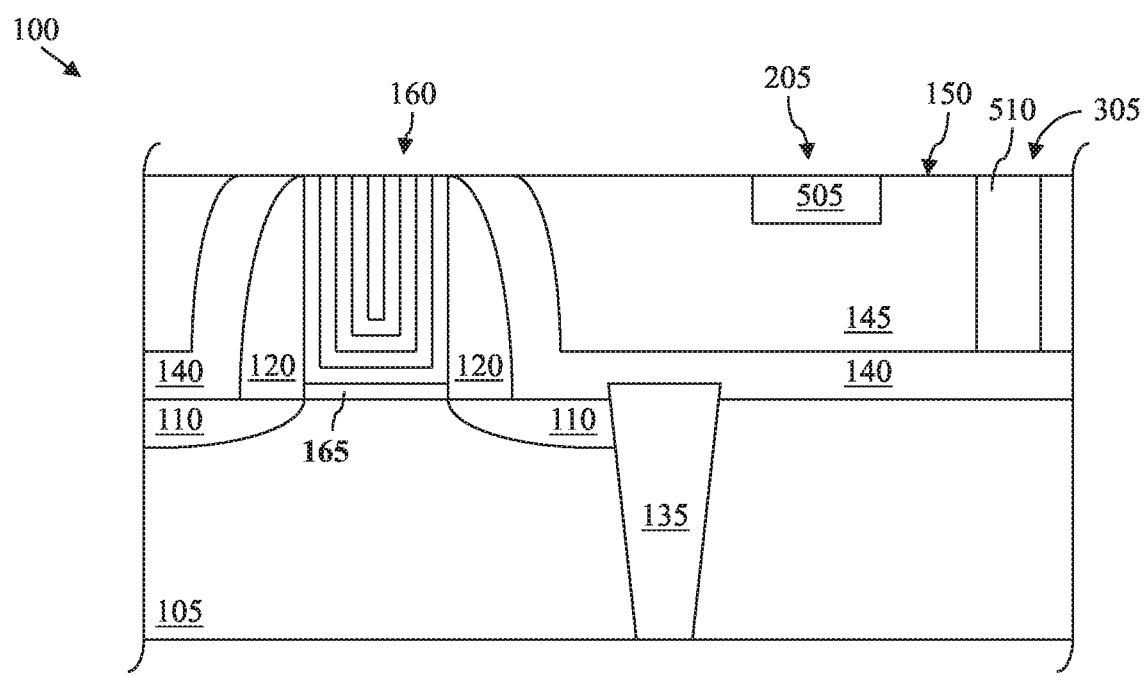
FIG. 7 is a schematic view of the apparatus shown in FIG. 6 in a subsequent stage of manufacture according to one or more aspects of the present disclosure.

FIG. 7 is a schematic view of the apparatus 100 shown in FIG. 6 in a subsequent stage of manufacture according to one or more aspects of the present disclosure, in which one or more CMP and/or other processes have been utilized to remove portions of the resistor metal layer 405 to approximately the level of the upper surface 150 of the one or more interlayer dielectric layers 145. Consequently, a thin resistor structure 505 remains in the opening 205, and a connection structure 510 remains in the opening 305. The thin resistor structure 505 comprises a thin film resistor formed from the resistor metal layer 405 shown in FIG. 6. The thin resistor structure 505 may be tuned utilizing, for example, CMP and/or other the processes described above, although other tuning methods and resistivity values are also within the scope of the present disclosure.

The thin resistor structure 505 and connection structure 510 may be formed via one or more integrated processes utilizing, for example, substantially the same material or composition. This may also or alternatively allow for greater flexibility in the design of integrated circuits while minimizing and streamlining the manufacturing process. For example, combining tuning of resistors with surface planarization, reducing additional masking layers, and eliminating one or more material deposition steps for resistors and connections in FEOL processing may simplify manufacturing steps and allow for greater design diversity with fewer materials. In this way, for example, one or more aspects of the present disclosure may reduce the complexity and/or costs associated with building circuits having integrated transistor and resistive devices.

Figure 8:
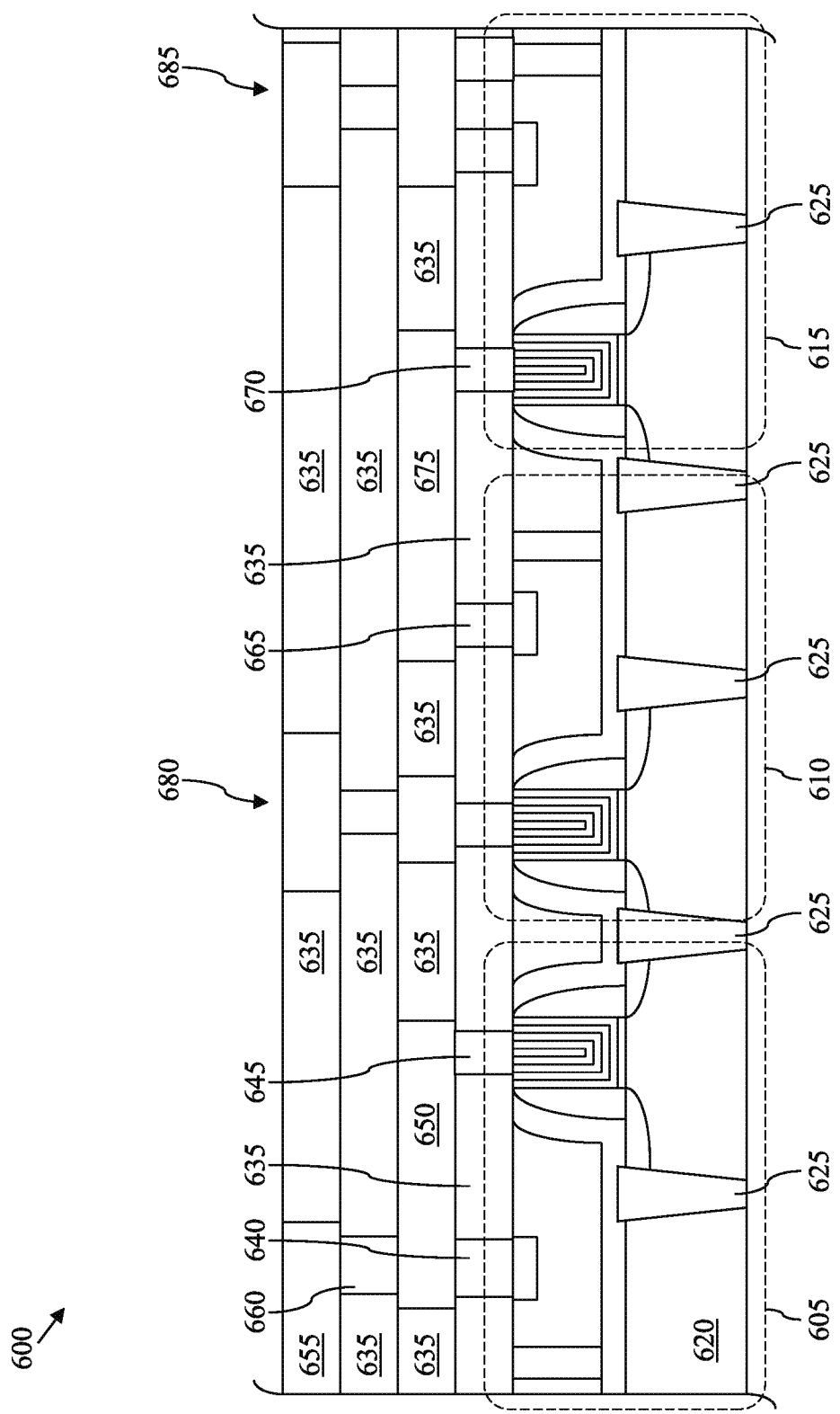
FIG. 8 is a schematic view of at least a portion of apparatus according to one or more aspects of the present disclosure.

FIG. 8 is a schematic view of at least a portion of an apparatus 600 according to one or more aspects of the present disclosure. The apparatus 600 may be or comprise an integrated circuit device, which is one environment in which the apparatus 100 shown in FIGS. 1-7 and/or other apparatus within the scope of the present disclosure may be implemented. For example, the illustrated portion of the apparatus 600 comprises at least portions of three microelectronic devices 605, 610, and 615, one or more of which may be substantially similar to the apparatus 100 shown in FIG. 7 and/or other apparatus within the scope of the present disclosure. However, the apparatus 600 may also comprise one or more devices other than those shown in FIGS. 1-7 or otherwise within the scope of the present disclosure.

The microelectronic devices 605, 610, and 615 may be formed substantially simultaneously from and/or on a single substrate 620, which may be substantially similar to the substrate 105 shown in FIGS. 1-7. One or more isolation structures 625 that may be formed between ones of the microelectronic devices 605, 610, and 615 may be substantially similar to the isolation structure 135 shown in FIGS. 1-7.

The apparatus 600 also comprises series of vias, traces, and/or other interconnects (which may hereafter be referred to collectively as "interconnects") extending along and/or through one or more dielectric layers 635 to one or more of the microelectronic devices 605, 610, and/or 615. The interconnects may comprise copper, tungsten, gold, aluminum, and/or other materials, and may be formed by CVD and/or other processes. The dielectric layers 635 may be substantially similar to the one or more interlayer dielectric layers 145 shown in FIGS. 1-7.

In the example implementation depicted in FIG. 8, the interconnects include a via 640 landing on the thin resistor structure of the microelectronic device 605, another via 645 landing on the multi-layer gate electrode of the microelectronic device 605, and a trace 650 interconnecting the vias 640 and 645. Accordingly, the components of the microelectronic device 605 may be interconnected in parallel, and may then be connected to one or more other portions of the apparatus 600 by another trace 655 connected to the trace 650 by an additional via 660. Similarly, a via 665 landing on the resistor structure of the microelectronic device 610 is connected to a via 670 landing on the multi-layer gate electrode of the microelectronic device 615 by a trace 675, which may then be connected to one or more other portions of the apparatus 600 by additional interconnections (not shown). The vias and traces of another interconnection series 680 connect the multi-layer gate electrode of the microelectronic device 610 to one or more other portions of the apparatus 600, and another interconnection series 685 connects the thin resistor structure and the connection structure of the microelectronic device 615 to one or more other portions of the apparatus 600. Of course, the scope of the present disclosure is not limited to the example interconnections depicted in FIG. 8, and indeed includes myriad other interconnection schemes.

In view of the entirety of the present disclosure, including FIGS. 1-8, a person having ordinary skill in the art should readily recognize that the present disclosure introduces a method comprising: forming a plurality of openings in a dielectric layer formed on a semiconductor substrate, wherein the plurality of openings comprises: a first opening extending to the semiconductor substrate; a second opening extending to a first depth that is substantially less than a thickness of the dielectric layer; and a third opening extending to a second depth that is substantially greater than the first depth; forming a multi-layer gate electrode in the first opening; and forming a thin resistor structure in the second opening and a connection in the third opening by filling the second and third openings substantially simultaneously with a resistor metal.

Forming the plurality of openings may further comprise substantially simultaneously forming at least a portion of each of the second and third openings.

Forming the multi-layer structure may comprise: forming at least one gate dielectric layer on the semiconductor substrate; forming a central gate electrode; and forming a plurality of structural layers collectively interposing the at least one gate dielectric layer and the central gate electrode, wherein each neighboring pair of the plurality of structural layers may comprise different materials. The central gate electrode may comprise a material selected from the group consisting of: aluminum; cobalt; copper; and tungsten. Each of the plurality of structural layers may comprise a material selected from the group consisting of: titanium nitride; tantalum nitride; titanium; titanium aluminum; hafnium oxide; lanthanum oxide; silicon oxide; silicon nitride; and silicon oxynitride.

The resistor metal may comprise tungsten.

The method may further comprise tuning resistivity of the thin resistor structure. Tuning resistivity of the thin resistor structure may comprise chemical-mechanical-planarization (CMP).

The method may further comprise: forming a contact etching stop layer on the semiconductor substrate; and forming the dielectric layer on the contact etching stop layer. The third opening may extend through the dielectric layer to the contact etching stop layer.

The present disclosure also introduces an apparatus comprising: a dielectric layer formed to a thickness over a semiconductor substrate; a multi-layer gate electrode extending substantially through the dielectric layer; a thin resistor structure formed in the dielectric layer and having a depth that is substantially less than the thickness; and a connection extending through the dielectric layer; wherein the thin resistor structure and the connection have substantially similar compositions.

The compositions of the thin resistor structure and the connection may substantially comprise a resistive material, such as tungsten.

The multi-layer structure may comprise: at least one gate dielectric layer on the semiconductor substrate; a central gate electrode; and a plurality of structural layers collectively interposing the at least one gate dielectric layer and the central gate electrode, wherein each neighboring pair of the plurality of structural layers may comprise different materials. The central gate electrode may comprise a material selected from the group consisting of: aluminum; cobalt; copper; and tungsten. Each of the plurality of structural layers may comprise a material selected from the group consisting of: titanium nitride; tantalum nitride; titanium; titanium aluminum; hafnium oxide; lanthanum oxide; silicon oxide; silicon nitride; and silicon oxynitride.

The apparatus may further comprise a contact etching stop layer between the semiconductor substrate and the dielectric layer. The connection may extend through the dielectric layer to the contact etching stop layer.

The present disclosure also introduces an apparatus comprising: a plurality of microelectronic devices formed on a semiconductor substrate, wherein each of the plurality of microelectronic devices comprises: a contact etching stop layer formed over the semiconductor substrate; a dielectric layer formed to a thickness over the contact etching stop layer; a multi-layer gate electrode extending substantially through the dielectric layer; a thin resistor structure formed in the dielectric layer and having a depth that is substantially less than the thickness; and a connection structure extending through the dielectric layer to the contact etching stop layer; wherein the thin resistor structure and the connection structure have substantially similar compositions; and an interconnect structure formed over and interconnecting ones of the plurality of microelectronic devices. The compositions of the thin resistor structure and the connection structure of each of the plurality of microelectronic devices may substantially comprise tungsten.

A method is provided in accordance with some embodiments. The method includes forming a plurality of openings in a dielectric layer formed on a semiconductor substrate, The plurality of openings comprises: a first opening and a second opening extending through the dielectric layer to the semiconductor substrate; and a third opening adjacent to the second opening, the third opening extending to a first depth that is less than a thickness of the dielectric layer. The method also includes forming a multi-layer gate electrode in the first opening. The method also includes forming a resistor in the third opening and a connection in the second opening by filling the second opening and the third opening simultaneously with a resistor metal. In an embodiment the method also includes forming the plurality of openings further comprises simultaneously forming at least a portion of each of the second opening and third opening. In an embodiment, forming the multi-layer gate electrode comprises: forming at least one gate dielectric layer on the semiconductor substrate; forming a central gate electrode; and forming a plurality of structural layers collectively interposing the at least one gate dielectric layer and the central gate electrode, wherein each neighboring pair of the plurality of structural layers comprises different materials. In an embodiment, the central gate electrode comprises a material selected from the group consisting of: aluminum; cobalt; copper; and tungsten. In an embodiment, each of the plurality of structural layers comprises a material selected from the group consisting of: titanium nitride; tantalum nitride; titanium; titanium aluminum; hafnium oxide; lanthanum oxide; silicon oxide; silicon nitride; and silicon oxynitride. In an embodiment, the resistor metal comprises tungsten. In an embodiment, the method also includes tuning a resistivity of the resistor. In an embodiment, tuning the resistivity of the resistor comprises performing chemical-mechanical-planarization (CMP) process on the resistor. In an embodiment, the method also includes forming a contact etch stop layer on the semiconductor substrate; and forming the dielectric layer on the contact etch stop layer. In an embodiment, the second opening extends through the dielectric layer to the contact etching stop layer.

A method is provided in accordance with some embodiments. The method includes forming a gate. The method also includes forming a dielectric layer around the gate. The method also includes forming a first opening and a second opening in the dielectric layer, the first opening and the second opening being formed simultaneously, each of the first opening and the second opening extending to a first depth, the first depth being a depth that is less than a thickness of the dielectric layer. The method also includes extending the first opening in the dielectric layer to penetrate through the dielectric layer, wherein after the first opening has been extended, the second opening extends to the first depth. The method also includes simultaneously filling the first opening and the second opening with a conductive material. In an embodiment, the first opening is adjacent to the second opening in the dielectric layer. In an embodiment, the conductive material comprises tungsten. In an embodiment, the first opening and the second opening are simultaneously filled with the conductive material using a chemical vapor deposition (CVD process). In an embodiment, the conductive material extends along a top surface of the dielectric layer after the first opening and the second opening are simultaneously filled with the conductive material, and the method further includes thinning the conductive material so that a top surface of the conductive material in the first opening is planar with the top surface of the dielectric layer.

A method is provided in accordance with some embodiments. The method includes forming a first gate over a semiconductor substrate. The method also includes forming an etch stop layer around the first gate. The method also includes forming a dielectric layer over the etch stop layer. The method also includes forming a first opening by removing the first gate, the first opening exposing the semiconductor substrate. The method also includes forming a second opening in the dielectric layer, the second opening having a depth that is less than a thickness of the dielectric layer. The method also includes forming a third opening in the dielectric layer, the third opening penetrating through the dielectric layer. The method also includes simultaneously filling the second opening and the third opening with a conductive material. The method also includes forming a second gate in the first opening. In an embodiment, at least portions of the first opening, the second opening, and the third opening are simultaneously formed. In an embodiment the method includes forming an interconnect structure over the dielectric layer, wherein a first conductor of the interconnect structure is physically and electrically connected to the conductive material filled in the second opening. In an embodiment a depth of the second opening is less than half a thickness of the dielectric layer. In an embodiment the conductive material comprises tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same aspects of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. § 1.72(b) to allow the reader to quickly ascertain the nature of the technical disclosure. It is submitted with the understanding that it will not be used to interpret or limit the scope or meaning of the claims.

What is claimed is:

1. A method, comprising:
   forming a plurality of openings in a dielectric layer formed on a semiconductor substrate, wherein the plurality of openings comprises:
      a first opening and a second opening extending through the dielectric layer to the semiconductor substrate; and
      a third opening adjacent to the second opening, the third opening extending to a first depth that is less than a thickness of the dielectric layer;
   forming a multi-layer gate electrode in the first opening; and
   forming a resistor in the third opening and a connection in the second opening by filling the second opening and the third opening simultaneously with a resistor metal.

2. The method of claim 1, wherein forming the plurality of openings further comprises simultaneously forming at least a portion of each of the second opening and third opening.

3. The method of claim 1, wherein forming the multi-layer gate electrode comprises:
   forming at least one gate dielectric layer on the semiconductor substrate;
   forming a central gate electrode; and
   forming a plurality of structural layers collectively interposing the at least one gate dielectric layer and the central gate electrode, wherein each neighboring pair of the plurality of structural layers comprises different materials.

4. The method of claim 3, wherein the central gate electrode comprises a material selected from the group consisting of:
   aluminum;
   cobalt;
   copper; and
   tungsten.

5. The method of claim 3, wherein each of the plurality of structural layers comprises a material selected from the group consisting of:
   titanium nitride;
   tantalum nitride;
   titanium;
   titanium aluminum;
   hafnium oxide;
   lanthanum oxide;
   silicon oxide;
   silicon nitride; and
   silicon oxynitride.

6. The method of claim 1, wherein the resistor metal comprises tungsten.

7. The method of claim 1, further comprising:
   tuning a resistivity of the resistor.

8. The method of claim 7, wherein tuning the resistivity of the resistor comprises performing chemical-mechanical-planarization (CMP) process on the resistor.

9. The method of claim 1, further comprising:
   forming a contact etch stop layer on the semiconductor substrate; and
   forming the dielectric layer on the contact etch stop layer.

10. The method of claim 9, wherein the second opening extends through the dielectric layer to the contact etch stop layer.

11. A method, comprising:
    forming a gate in a dielectric layer;
    forming a first opening and a second opening in the dielectric layer, the first opening and the second opening being formed simultaneously, each of the first opening and the second opening extending to a first depth, the first depth being a depth that is less than a thickness of the dielectric layer;
    extending the first opening in the dielectric layer to penetrate through the dielectric layer, wherein after the first opening has been extended, the second opening remains extending to the first depth; and
    simultaneously filling the first opening and the second opening with a conductive material.

12. The method according to claim 11, wherein the first opening is adjacent to the second opening in the dielectric layer.

13. The method according to claim 11, wherein the conductive material comprises tungsten.

14. The method according to claim 11, wherein the first opening and the second opening are simultaneously filled with the conductive material using a chemical vapor deposition (CVD process).

15. The method according to claim 11, wherein conductive material extends along a top surface of the dielectric layer after the first opening and the second opening are simultaneously filled with the conductive material, and the method further comprises thinning the conductive material so that a top surface of the conductive material in the first opening is planar with the top surface of the dielectric layer.

16. A method, comprising:
    forming a dielectric layer over an etch stop layer;
    forming a gate in a first opening in the dielectric layer;
    forming a second opening in the dielectric layer, the second opening having a depth that is less than a thickness of the dielectric layer;
    forming a third opening in the dielectric layer, the third opening penetrating through the dielectric layer; and
    simultaneously filling the second opening and the third opening with a conductive material.

17. The method according to claim 16, wherein at least portions of the first opening, the second opening, and the third opening are simultaneously formed.

18. The method according to claim 16, further comprising:
    forming an interconnect structure over the dielectric layer, wherein a first conductor of the interconnect structure is physically and electrically connected to the conductive material filled in the second opening.

19. The method according to claim 16, wherein a depth of the second opening is less than half a thickness of the dielectric layer.

20. The method according to claim 16, wherein the conductive material comprises tungsten.

\* \* \* \* \*